US006630854B2

(12) United States Patent
Corva et al.

(10) Patent No.: US 6,630,854 B2
(45) Date of Patent: Oct. 7, 2003

(54) CONTROLLED VOLTAGE MONOSTABLE CIRCUIT

(75) Inventors: Giulio Corva, Vittuone (IT); Ignazio Bellomo, Ponte Sesto Di Rozzano (IT)

(73) Assignee: STMicroelectronics S.r.l., Milan (IT)

( * ) Notice: Subject to any disclaimer, the term of this patent is extended or adjusted under 35 U.S.C. 154(b) by 0 days.

(21) Appl. No.: 10/047,305

(22) Filed: Jan. 14, 2002

(65) Prior Publication Data

US 2003/0015999 A1 Jan. 23, 2003

(30) Foreign Application Priority Data

Jan. 15, 2001 (IT) ..................................... MI2001A0057

(51) Int. Cl.$^{7}$ ................................................ H03K 3/033
(52) U.S. Cl. ........................................................ 327/227
(58) Field of Search ................................ 323/266, 268, 323/270, 271, 273, 274, 275, 279; 327/50, 58, 60, 62, 72, 74, 77, 227, 230, 261, 262

(56) References Cited

U.S. PATENT DOCUMENTS 4,039,868 A * 8/1977 Aono et al. ................. 307/273
5,506,533 A * 4/1996 Wu ............................ 323/277
6,498,617 B1 * 12/2002 Ishida et al. ................ 347/252

* cited by examiner

*Primary Examiner*—Matthew V. Nguyen
(74) *Attorney, Agent, or Firm*—Hogan & Hartson L.L.P.

(57) ABSTRACT

The present invention relates a monostable circuit adapted to provide a delay having a length inversely proportional to an input signal, characterized by comprising generating means (21, 22) adapted to generate a signal proportionally to an input signal (Vin) and to a corrective factor (35), comparing means (23) adapted to compare the value of said signal with a prefixed value range (Imin, Imax) and correcting means (24) adapted to correct said corrective factor (35) in the case that the value of said signal is out of said prefixed value range (Imin, Imax).

16 Claims, 6 Drawing Sheets

CONTROLLED VOLTAGE MONOSTABLE CIRCUIT

BACKGROUND OF THE INVENTION

The present invention relates to a controlled voltage monostable circuit.

In some applications a monostable circuit is needed, adapted to generate a pulse, having a time length inversely proportional to a voltage. This voltage needs to control said monostable circuit so that the time length of the pulse can be modified in a large range of time values.

A typical monostable circuit, according to the prior art, such to ensure the request heretofore, foresees a delay element and a memory element connected in feedback configuration.

However the circuit embodiments of such circuits do not guarantee performances, such as precision and consumptions, equal to what is attainable by means of less stringent conditions of the variability of the length of the pulse.

In view of the state of the art described, it is an object of the present invention to avoid the limits and problems of the circuits of the prior art.

SUMMARY OF THE INVENTION

According to the present invention, such object is achieved by a monostable circuit adapted to provide a delay having a length inversely proportional to an input signal, characterized by comprising generating means adapted to generate a signal proportionally to an input signal and to a corrective factor, comparing means adapted to compare the value of said signal with a prefixed value range and correcting means adapted to correct said corrective factor in the case that the value of said signal is out of said prefixed value range.

According to the present invention, such object is also obtained by a method for generating a delay having a length inversely proportional to signal, characterized by comprising the following steps: a) to generate a signal proportionally to an input signal and to a corrective factor; b) to compare the value of said signal with a prefixed value range; c) to correct said corrective factor in the case that said signal is out of said prefixed value range.

Thanks to the present invention it is possible making a monostable circuit having a maximum length of the switching pulse greater than various ranks of the minimum length of said switching pulse.

BRIEF DESCRIPTION OF THE DRAWINGS

The features and the advantages of the present invention will be made evident by the following detailed description of an embodiment thereof, which is illustrated as not limiting example in the annexed drawings, wherein.

DETAILED DESCRIPTION

Figure 1:
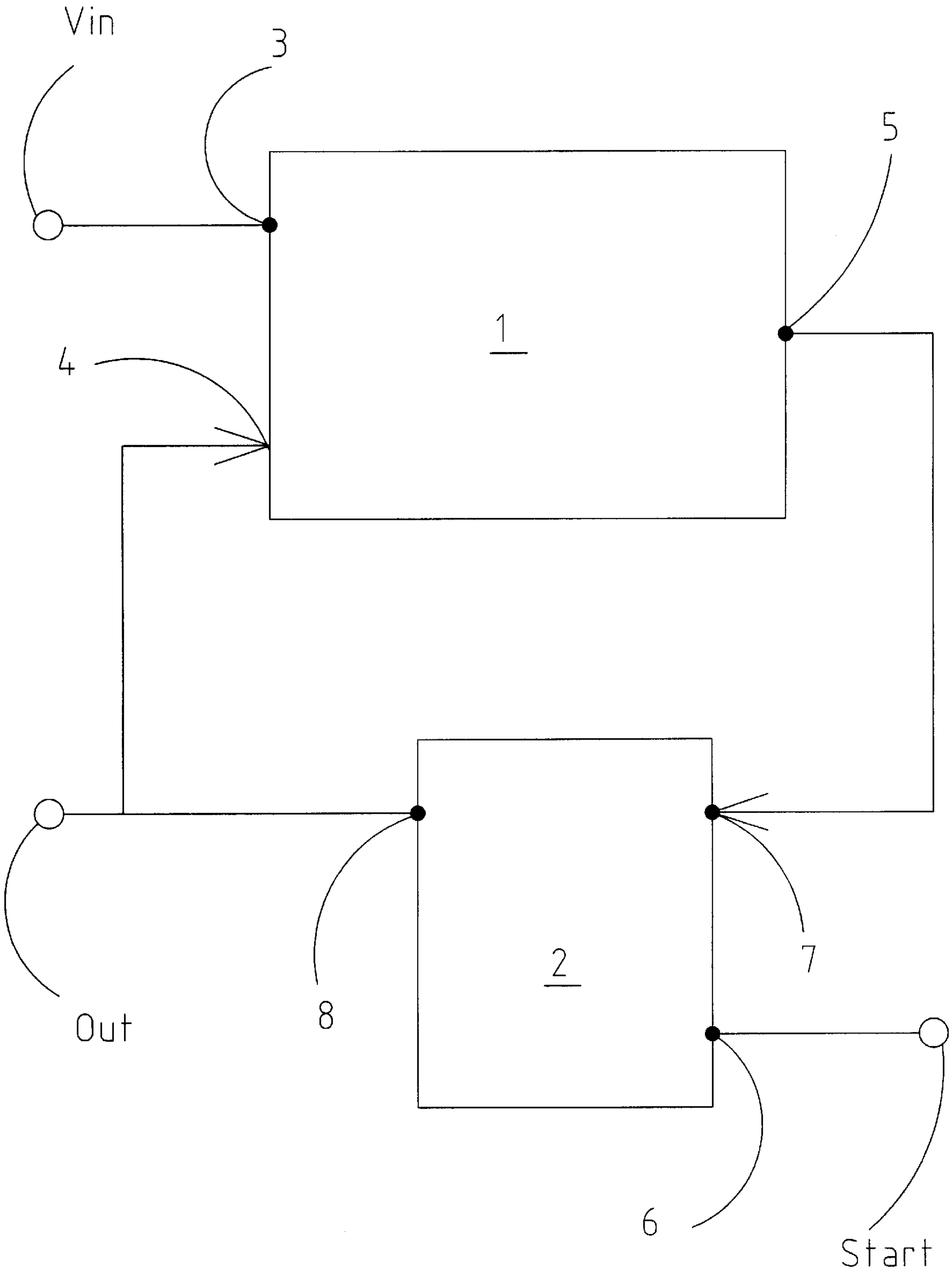
Fig.1 PRIOR ART
FIG. 1 shows a basic scheme of a controlled voltage monostable circuit, according to the prior art.

In FIG. 1 a basic scheme of a controlled voltage monostable circuit, according to the prior art is shown.

According to what shown in such a Figure, there are noted a first block 1, and a second block 2, connected in feedback configuration.

The block 1 is a delay circuit, having a first input 3 for a control voltage Vin, a second input 4 adapted to receive the output of said second block 2, and an output 5.

The block 2 is a Set-Reset type flip flop memory circuit, having a first input 6 connected to a line Start, a second input 7 connected to the output 5 of said first block 1, and an output 8 connected to said second input 4 of said first block 1.

The output 8 is the output Out of the monostable circuit shown in Figure.

Figure 2:
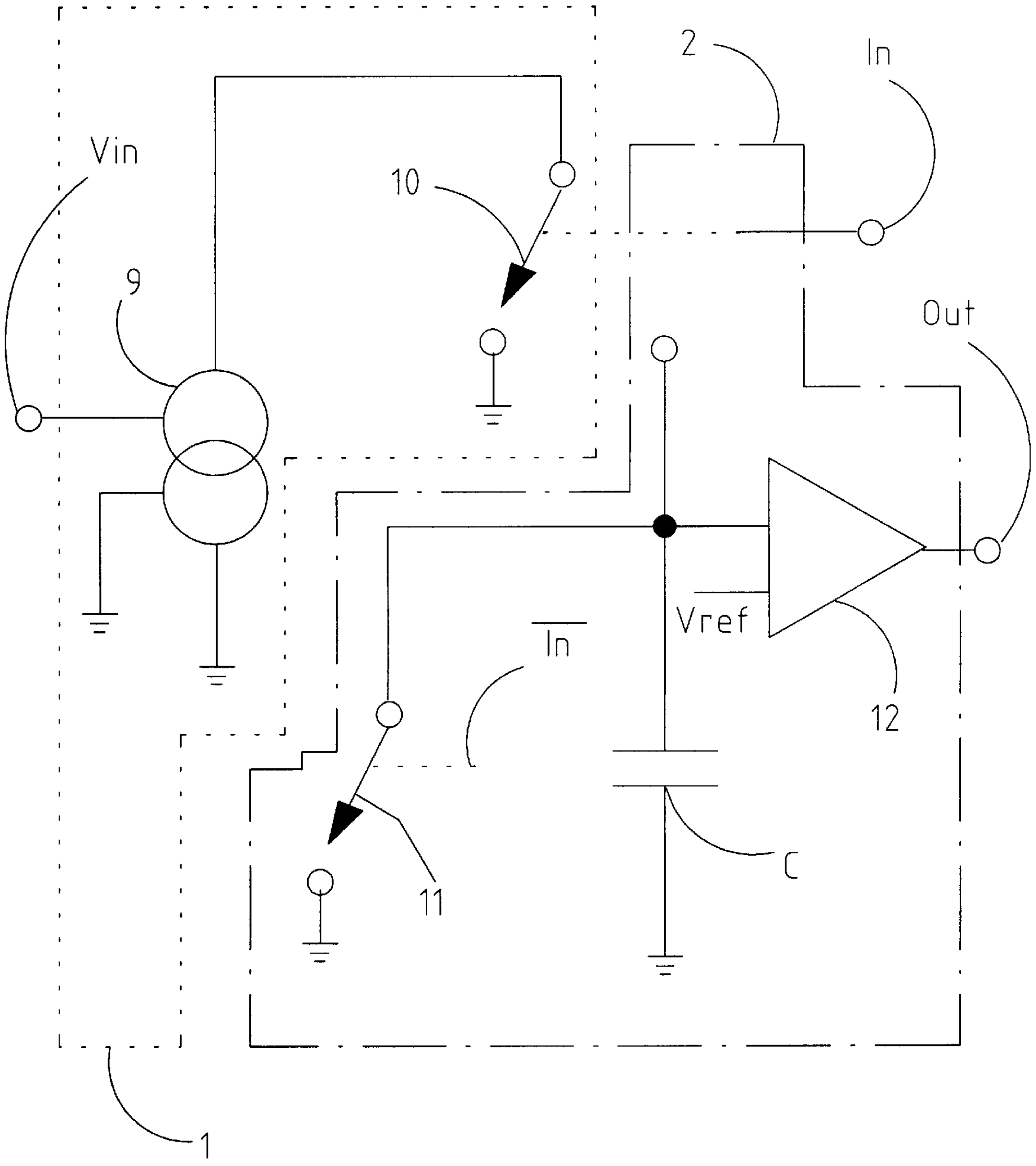
Fig.2 PRIOR ART
FIG. 2 shows a schematic circuit of a block of FIG. 1.

The basic scheme of the block 1 of FIG. 1 is circuitally shown in FIG. 2, wherein it is to be noted that the block 2 is realized by a voltage converter 9 and by a first switch 10. Said switch 10 is controlled to switch by a first signal In.

The block 2 is formed by a capacitor C, a second switch 11 and a comparator 12. Said second switch 11 is controlled to switch by the inverted version of said first signal In. Said capacitor C is connected by a side to ground and by the other side to the non inverting terminal of the comparator 12 and to the switch 10.

The voltage current converter 9 receives the control voltage Vin and it provides a current proportional to said voltage Vin. When the signal Vin controls to close the switch 10 and to open the switch 11, said current charges the capacitor C. To the terminals of the capacitor C a voltage Vc is present that is compared by the comparator 12 with a reference voltage Vref so as to provide the output signal Out when Vc>Vref.

When the signal In controls to open the switch 10 and to close the switch 11, the charge contained in said capacitor C discharges toward the ground.

Figure 3:
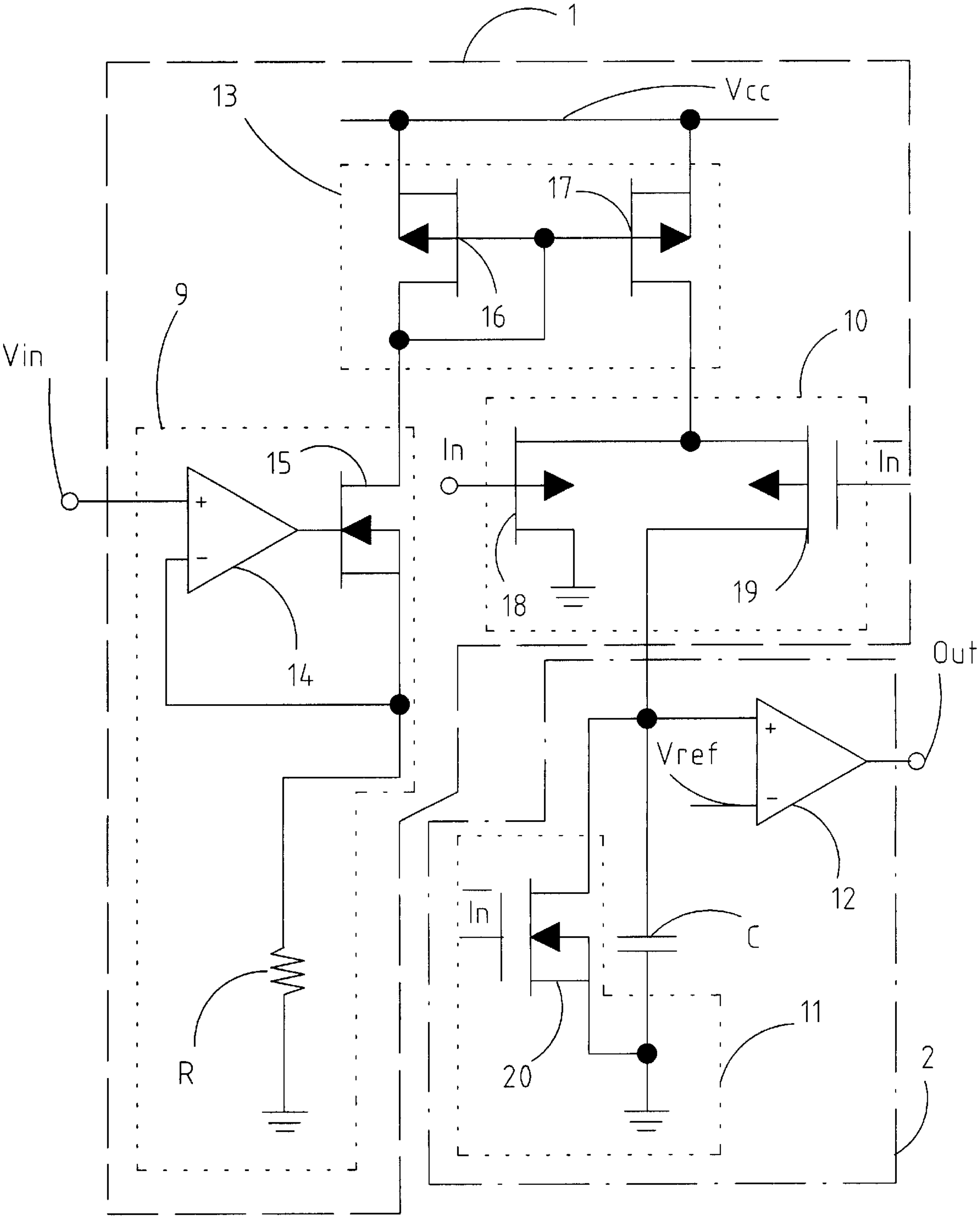
Fig.3 PRIOR ART
FIG. 3 shows in greater detail the schematic circuit of FIG. 2.

In FIG. 3 in greater detail the schematic circuit of FIG. 2 is shown.

The block 1, besides comprising the voltage current converter block 9 and the switch block 10, comprises also a block 13 connected to a supply line Vcc.

Particularly, the voltage current converter 9 is realized by a sense amplifier 14, on the output of which is connected a n channel MOS transistor 15 in source follower configuration and by a resistance R, connected by a side to the inverting terminal of said sense amplifier 14 and to the source terminal of said transistor 15 and to the other side to ground.

The block 13 is realized by means of a couple of p channel MOS transistors 16 and 17 placed in mirror configuration, wherein the transistor in transdiode configuration 16 is connected to the drain terminal of said transistor 15 and the transistor 17 is connected to the switch block 10.

The block 10 is realized by means of a further couple of p channel MOS transistors 18 and 19, wherein the first transistor 18 has the gate terminal connected to the signal In, the source terminal to ground and the drain terminal in common with the drain terminal of the second transistor 19.

Said second transistor 19 has the gate terminal connected with the inverted signal In while the source terminal is connected to the block 2.

The switch 11, being part of the block 2, is realized by a n channel MOS transistor 20 having the gate terminal connected to the inverted signal In, the drain terminal connected to the non inverting terminal of said comparator 12 and with the transistor 19, and the source terminal to ground.

The way of working of such a circuit foresees that the current generated by the voltage current converter 9, in function of the input voltage Vin placed in input, is mirrored by the block 13 and stored in the capacitor C, when the signal In is low (therefore inverted signal In high and transistors 18 and 20 OFF and transistor 19 ON).

It is to be noted that the input voltage Vin and, therefore, the current generated by the converter 9, follow the same variability of the pulse length causing that the generated current by the converter 9 can not be too little, penalty an increment of the mirror error of the block 13. This happens because due to a mirror realized with MOS transistors working in depth inversion the mirror error is inversely proportional to the square of the used current.

Moreover the precision of a current having a very low value is limited by the presence of the leakage currents of the junctions making the various transistors.

Moreover the highest current can not be too high for consumption reasons.

Moreover, in order to obtain a correct way of working, the highest current can not be too high because the voltage drop on the transistors of the block 13 must not exceed a given value, elaborated in function of the supply voltage value Vcc and of the implementing parameters of the MOS transistors.

Moreover the dimensioning of the passive components of the circuit, that is of the resistance R and of the capacitor C, besides the dimensioning of the mirror 13, have to be evaluated so as to maintain unchanged the performances of the circuit also in extreme conditions of working.

In fact the known circuits, if the variability of the input voltage Vin is higher, show a incorrect dimensioning of the components favoring therefore an inaccuracy for little input voltage, because this provides long pulses, and a high consumption for high voltages, because this provides short pulses.

Figure 4:
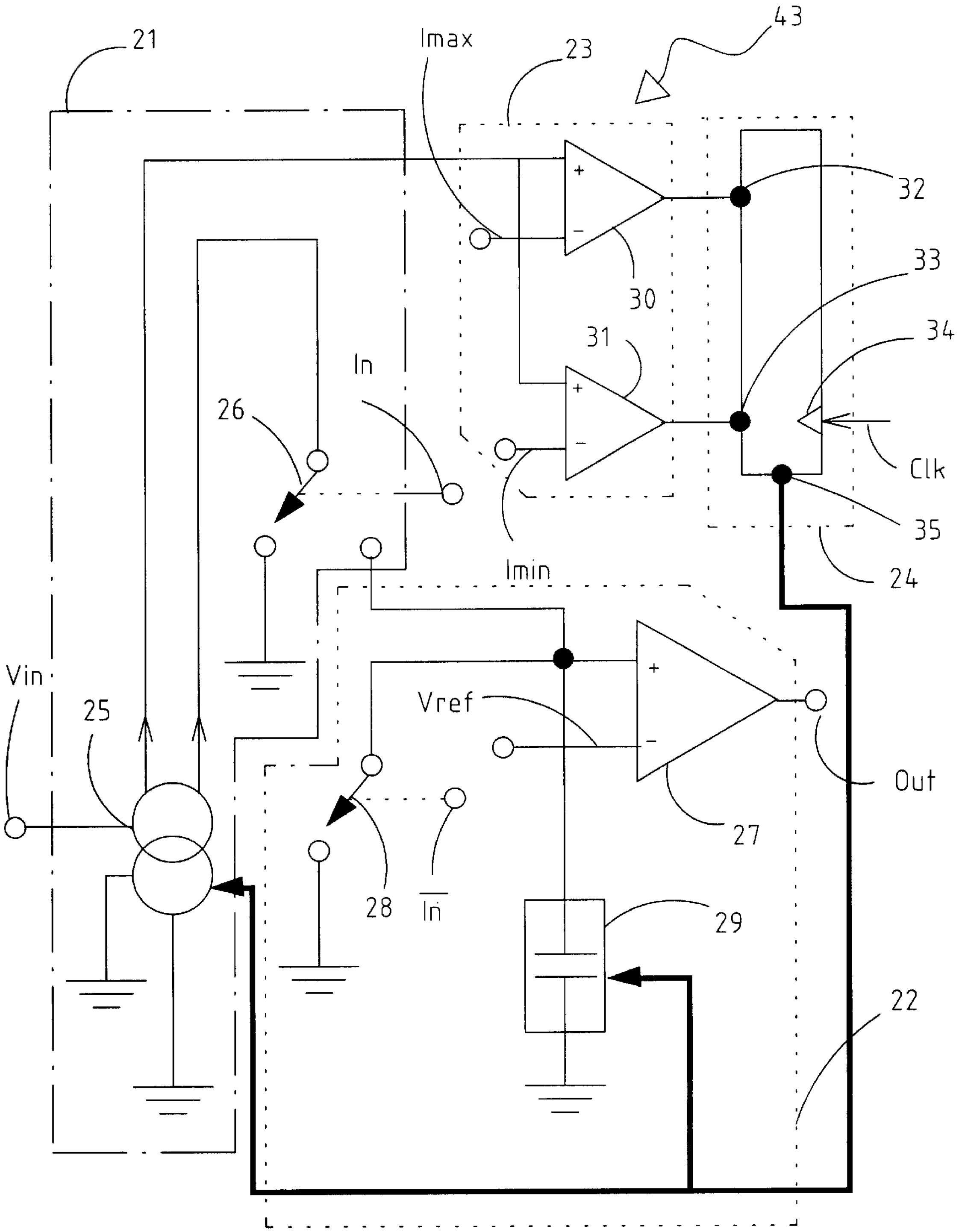
FIG. 4 shows a schematic circuit of the controlled voltage monostable circuit according to the present invention.

In FIG. 4 a schematic circuit, pointed with 43, of the controlled voltage monostable circuit according to the present invention is shown.

In such a Figure there are noted a first block 21, adapted to realize a voltage current converter, a second block 22 adapted to realize a storing circuit, a third block 23 adapted to realized a comparator, and a fourth block 24 adapted to realized a control logic.

The block 21 has a voltage current converter 25 connected to a supply line Vin, to a first switch 26 and to the block 23.

The switch 26 is controlled to switch by a line In between a state connected to ground and a state connected to the block 22.

The block 22 has a comparator 27 having its own non inverting terminal connected to said first switch 26, to a second switch 28 and to the block 29.

The comparator 27 having its own inverting terminal connected to a reference voltage Vref and its own output terminal connected with an output line Out. The switch 28 is controlled to switch, between a state connected to ground and an open circuit state, by the inverted version of the signal In, that is by the inverted In.

The block 23 is realized by a couple of comparators 30 and 31 having their own non inverting terminals connected with said voltage current converter 25 and their own outputs with said control logic 24.

The comparator 30 has its own non inverting terminal connected with a first reference current Imax, while the comparator 31 has its own non inverting terminal connected with a second reference current Imin.

The control logic 24 has a first input 32 connected with the output terminal of said second comparator 30, a second input terminal 33 with the output terminal of said comparator 31, a third input terminal 34 with a timing signal Clk and an output terminal 35 connected with said voltage current converter 25 and with said block 29.

Particularly the voltage current converter 25, thanks to a resistive block, hereinafter shown in FIG. 5, has a transconductance that can assume N distinct resistive values each other scaled correspondently to the assumed value by the control digital value on the output terminal 35 of the logic 24, that is:

$$g_m=R,\ R/K,\ R/K^2,\ \ldots,\ R/K^N$$

where K is number greater than one.

Particularly the block 29 is realized by an array of N capacitors C, each of them is K time smaller than the previous, that is:

$$C,\ C/K,\ C/K^2,\ \ldots,\ C/K^N$$

Particularly the first value of the reference current Imax of the comparator 30 is connected with the second value of the reference current Imin by the following relationship:

$$Imax=A*Imin$$

Particularly the block 24 realizes an up/down counter that receives the timing signal Clk from an external timing generator (not shown in Figure) and the digital output 35 of which controls the transconductance $g_m$ of the voltage current converter 25 and it selects one of the capacitors of the array 29.

Figure 5:
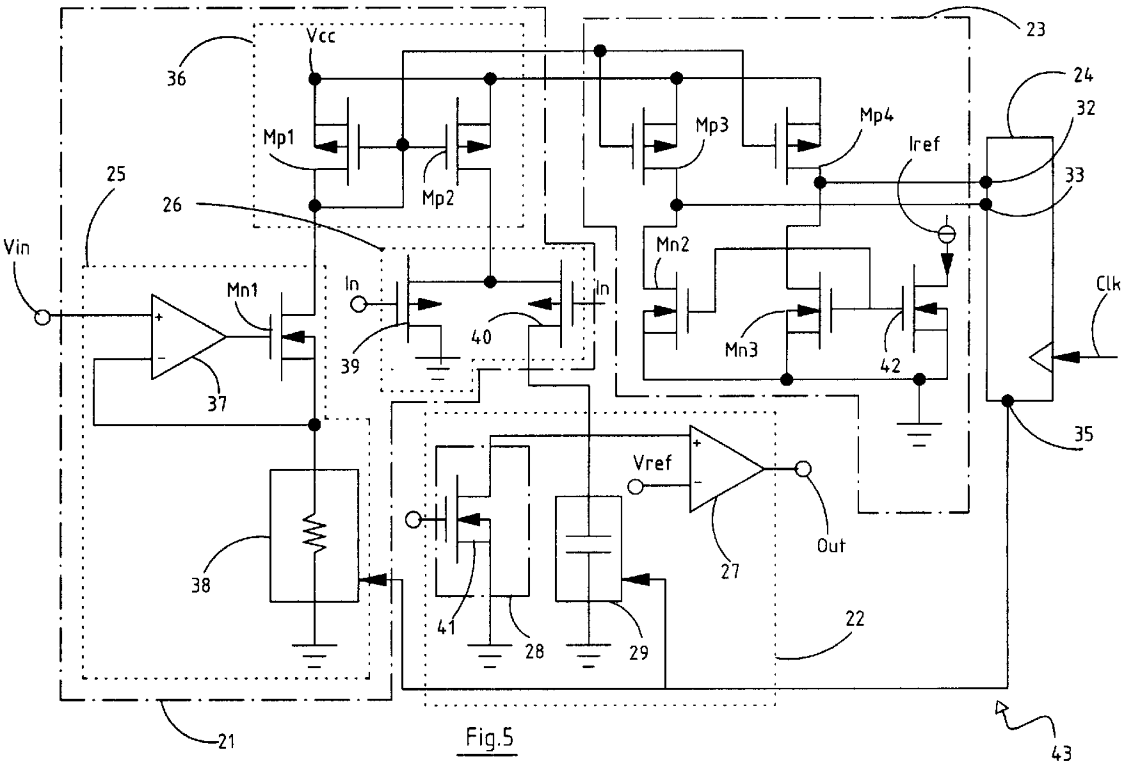
FIG. 5 shows in detail the schematic circuit of FIG. 4.

In FIG. 5 the circuit scheme of FIG. 4 is shown in greater detail.

In fact the block 21 besides comprising the voltage current converter 25 and the switch block 26 comprises also a block 36 connected to the supply line Vcc.

Particularly the voltage current converter 25 is realized by a sense amplifier 37, on the output of which is connected a n channel MOS transistor Mn1 in source follower configuration and a resistive block 38, connected by a side to the non inverting terminal of said sense amplifier 37 and to the source terminal of said transistor Mn1, and to the other side to the ground and it is controlled by the output 35 of the logic 24.

The block 36 is realized by a couple of p channel MOS transistors Mp1 and Mp2 placed in mirror configuration, wherein the transistor in transdiode configuration Mp1 is connected to the drain terminal of said transistor Mn1 and the transistor Mp2 is connected to the switch block 26.

The switch block 26 is realized by a further couple of p channel MOS transistors 39 and 40, wherein the first transistor 39 has the gate terminal connected to the signal In, the source terminal connected to ground and the drain terminal in common with the drain terminal of the second transistor 40.

Said second transistor 40 has the gate terminal connected to the inverted signal In whilst the source terminal is connected to the block 22.

The switch 28 is realized by an n channel MOS transistor 41 having the gate terminal connected to the inverted signal In, the drain terminal connected with the non inverting terminal of said comparator 27 and with the transistor 40, and the source terminal connected to ground.

The comparator block 23 has two comparators 30 and 31 that are implemented using two p channel MOS transistors Mp3 and Mp4 added to the current mirror 36 and having two n channel MOS transistors Mn3 and Mn3 respectively as reference current generators Imax and Imin, being the transistors Mn2 and Mn3 biased by a reference current generator Iref by means of a further n channel MOS transistor 42, having its own gate terminal connected to the gate terminals of said transistors Mn2 and Mn3 and its own source terminal connected to the source terminals of said transistors Mn2 and Mn3.

The drain terminal of the transistor Mp4 is connected to the input terminal 32 of the block 24 and the drain terminal of the transistor Mp3 is connected to the input terminal 33 of the block 24.

Particularly the terminal 32 is the detecting of a high signal (UP) and the terminal 33 is the detecting of a low signal (DOWN).

The way of working of such a circuit foresees the generation of a current from the voltage current converter 25 in function of the input voltage and by feedback from the digital output 35.

Said current is mirrored by the block 36 and stored in a capacitor of the block 29 in function of said digital output 35, when the signal In is low.

Particularly in the inventive embodiment the couple resistance 38, adapted to determine the transconductance $g_m$ of the voltage current converter 25, and the capacitor 29, is, therefore, chosen by the logic 24 so as to maintain the generated current in the value range between Imin and Imax. All the N couples of resistances 38 and capacitors 29 have the same resistance for capacitor product value.

A possible embodiment foresees that for every resistance capacitor couple there is a respective switch (not shown in Figure) controlled in function of the digital word contained in the output 35 of the block 24, so as to select a resistance able to maintain the current generated by the converter 25 in the value range between Imin and Imax.

The couple of inputs 32 and 33 of the logic 24, that is the outputs of the comparators 30 and 31 provide to the logic block 24 the news of increment, in the case of the current generated by the converter 25 is too high, and of decrement, in the case of the current generated by the converter 25 is too low, or no counting if the current generated by the converter 25 is in the comparison range Imin and Imax.

Particularly it is to be noted that the news of increment means inserting a resistance 38 immediately higher, and it vales the dual for the news of decrement.

Therefore the logic 24 is a correction circuit of the signal generated by the voltage current converter 25.

By way of example thinking that the input voltage Vin is incrementing, the resistance commutations happen as described by the following table:

| Vin min | Vin max | Cor min | Cor. max | Res. | Cap. |
|---|---|---|---|---|---|
| R Imin | R Imax | Imin = Imax/A | Imax | R | C |
| K R Imax | K R Imax | Imax/K | Imax | K R | C/K |
| . . . | . . . | . . . | Imax | . . . | . . . |
| $K^{N-2}$ R Imin | $K^{N-1}$ R Imax | Imax/K | Imax | $K^{N-1}$ R | $C/K^{N-1}$ |

K must be less or equal to A, because the inserting of one of the N resistances of the resistive block 38 is that one immediately higher so as to re-enter the current generated by the converter 25 in the range between Imin and Imax.

The ratio between the maximum and minimum input voltage, that is (Vin max/Vin min), among which the current remains contained in the range between Imin and Imax, is: $K^{N-1}*A$.

If K=A is chosen, the ratio (Vin max/Vin min) is the highest, whilst if K<A, the obtainable range by the ratio (Vin max/Vin min) is reduced, but an hysteresis useful to make stronger the circuit with respect to eventual noises on the outputs of the two comparators 30 and 31 is introduced.

It is to be noted also that if the input voltage is incrementing the plurality of resistances 38 are switched so as the current generated by the converter 25 remains always around the highest values of the range Imin and Imax, that is between Imax/K and Imax.

In the case of the input voltage is decrementing, the current generated by the converter 25 remains always around the lowest values of the range Imin and Imax, that is between Imim and K*Imim.

Figure 6:
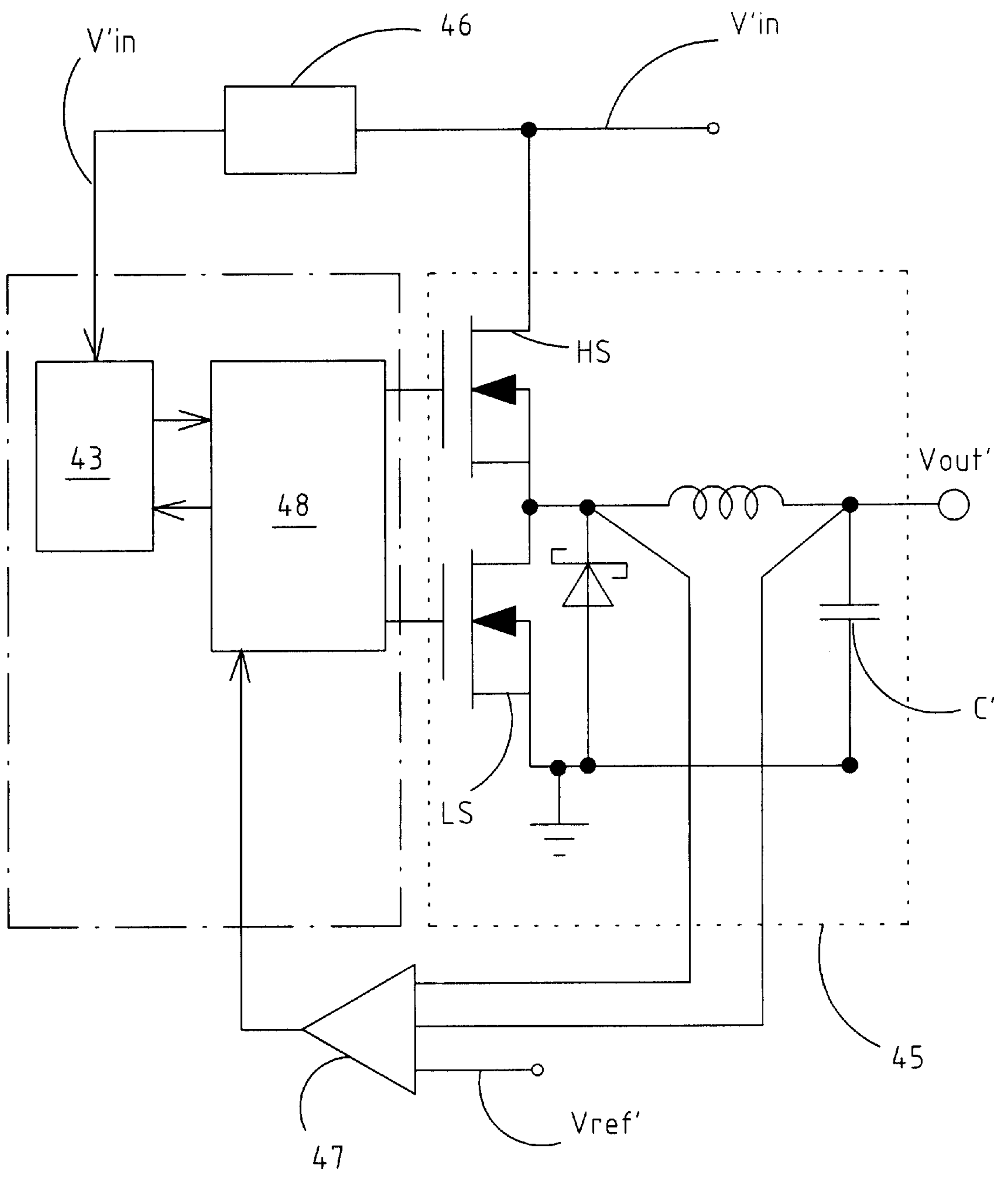
FIG. 6 shows an application of the controlled voltage monostable circuit according to the present invention.

In FIG. 6 an application of the controlled voltage monostable circuit according to the present invention is shown.

In such a figure it is to be noted the inventive circuit 43 is connected with a logic block 48 and with a first divider block 46.

The logic block 48 is connected to a comparator 47 and to a power output stage 45.

The power block 45 is connected with a supply line Vin' and it outputs a voltage Vout'.

The block 46 is a divider having a prefixed damped ratio Δ. Said block receives in input the input voltage Vin' and outputs the control voltage if the inventive circuit 43, that is Vin.

The block 45 is realized by a power MOS stage HS and LS, wherein the transistor Hs has the drain terminal connected to the supply line Vin', the gate terminal with the block 48 and the source terminal in common with the drain terminal of the transistor LS and with a load L'-C'.

The transistor LS has the source terminal connected to ground and the gate terminal connected with said block 48.

The application shown in FIG. 6 is a dc-dc buck converter, that is a converter wherein Vout' is lower than Vin'. Particularly the monostable circuit 43 determines the length of the turning on of the MOS HS that connects to the input line the inductor L'.

The instant of turning on is elaborated by the comparator 47 that compares the current that flows in the inductor L', the voltage on the capacitor C' with a reference voltage Vref', so as to turn on said MOS HS when the linear combination of the current that flows in the inductor L' and of the voltage on the capacitor C' decreases under a reference value Vref.

Being the switching period directly proportional to the length of the pulse, to the input voltage Vin' and inversely proportional to the output voltage Vout', by using the inventive monostable circuit 43 it is obtainable that the switching frequency of the same monostable 43 is independent from the input voltage Vin'.

In fact the length of the pulse can be written as:

$$t_{ON}=\Omega/Vin' \quad (1)$$

where Ω is the constant of the monostable 43.

The switching frequency is:

$$f_{SW}=Vout'/(Vin'*t_{ON}) \quad (2)$$

Therefore the input voltage Vin of the monostable 43 is:

$$Vin=\Delta*Vin'=\Omega*f_{SW}*Vin'/Vout' \quad (3)$$

It is possible to deduce that the variation of Vin is the sum of the variations of Vin' and $f_{SW}$.

What is claimed is:

1. A monostable circuit for providing a delay that is inversely proportional to an input signal, comprising:

means for generating a signal proportional to an input signal and to a corrective factor;

means for comparing the value of said generated signal with a prefixed value range; and means for correcting said corrective factor if the value of said generated signal is out of said prefixed value range.

2. A monostable circuit according to claim 1, in which said generating means comprises a voltage-to-current converter connected on one side to a comparator and to a capacitive block, including a plurality of capacitors, by means of a switch block, and, on the other side, with said comparing means.

3. A monostable circuit according to claim 2, in which said voltage-to-current converter comprises a sense amplifier having an output terminal coupled to a first transistor in source follower configuration including a resistive block including a plurality of resistance values.

4. A monostable circuit according to claim 3 in which the first transistor comprises an N-channel MOS transistor.

5. A monostable circuit according to claim 3, in which said resistive block comprises N different resistive values scaled to each other corresponding to the value of said corrective factor present on an output of said correction means.

6. A monostable circuit according to claim 2, in which said capacitive block comprises a plurality of capacitor values.

7. A monostable circuit according to claim 1, in which said comparing means comprises a comparator.

8. A monostable circuit according claim 7, in which said comparator comprises second and third transistors coupled respectively to fourth and fifth transistors.

9. A monostable circuit according to claim 8 in which the second and third transistors each comprise an N-channel MOS transistor.

10. A monostable circuit according to claim 8 in which the fourth and fifth transistors each comprise an N-channel MOS transistor.

11. A monostable circuit according to claim 7, further comprising a sixth transistor for biasing said fourth and fifth transistors.

12. A monostable circuit according to claim 11 in which the sixth transistor comprises an N-channel MOS transistor.

13. A monostable circuit according to claim 6, in which said correction means comprises an input coupled to the outputs of said second and third MOS transistors and an output for providing said corrective factor in order to maintain said value of said generated signal in the value range of said comparing means.

14. A monostable circuit according to claim 8, in which the product of said resistance value and said capacitor value is constant.

15. A method for generating a delay having a length inversely proportional to signal, comprising:

a) generating a signal proportionally to an input signal and to a corrective factor;

b) comparing the value of said generated signal with a prefixed value range; and c) correcting said corrective factor in the case that said generated signal is out of said prefixed value range.

16. A DC-to-DC buck converter circuit comprising:

a divider having an input for receiving an input signal and an output;

a monostable circuit for providing a delay inversely proportional to and having a switching frequency independent of said input signal, having an input coupled to the output of the divider, and an output;

a logic block having an input coupled to the output of the monostable circuit, and an output;

a power block having an input coupled to the output of the logic block, and an output for providing an output voltage; and a comparator in communication with said power block for providing feedback to said logic block.

* * * * *